US010644678B2

(12) United States Patent
Jung

(10) Patent No.: US 10,644,678 B2
(45) Date of Patent: May 5, 2020

(54) OSCILLATOR AND MEMORY SYSTEM INCLUDING THE SAME

(71) Applicant: SK hynix Inc., Gyeonggi-do (KR)

(72) Inventor: Jong Seok Jung, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/165,601

(22) Filed: Oct. 19, 2018

(65) Prior Publication Data

US 2019/0280676 A1  Sep. 12, 2019

(30) Foreign Application Priority Data

Mar. 12, 2018  (KR) .................. 10-2018-0028760

(51) Int. Cl.
*H03K 19/00*  (2006.01)
*H03K 3/012*  (2006.01)
*H03K 3/03*  (2006.01)
*H03K 5/00*  (2006.01)
*G06F 3/06*  (2006.01)

(52) U.S. Cl.
CPC ........... *H03K 3/012* (2013.01); *G06F 3/0604* (2013.01); *G06F 3/0659* (2013.01); *G06F 3/0673* (2013.01); *H03K 3/0315* (2013.01); *H03K 5/00* (2013.01); *H03K 2005/00078* (2013.01)

(58) Field of Classification Search
CPC ..... H03K 3/012; G06F 3/0604; G06F 3/0659; G06F 3/0673
USPC .................................................. 365/189.011
See application file for complete search history.

(56) References Cited

U.S. PATENT DOCUMENTS

| 7,282,937 | B2 * | 10/2007 | Muniandy | G06F 1/04 324/750.3 |
|---|---|---|---|---|
| 9,692,414 | B2 * | 6/2017 | Miller | H03K 19/0013 |
| 2005/0140418 | A1 * | 6/2005 | Muniandy | G06F 1/04 327/291 |
| 2007/0046330 | A1 | 3/2007 | Forbes | |
| 2016/0065220 | A1 * | 3/2016 | Rana | H03K 3/0315 331/1 R |
| 2016/0133314 | A1 * | 5/2016 | Hwang | G11C 11/40611 365/189.02 |
| 2017/0012624 | A1 * | 1/2017 | Miller | H03K 19/0013 |

FOREIGN PATENT DOCUMENTS

| KR | 1019910008952 | 5/1991 |
|---|---|---|
| KR | 1019940020676 | 9/1994 |

\* cited by examiner

*Primary Examiner* — Xiaochun L Chen
(74) *Attorney, Agent, or Firm* — IP & T Group LLP

(57) ABSTRACT

There are provided an oscillator and a memory system including the same. In the oscillator including an odd number of inverters sequentially coupled, in which an output signal of an inverter of a last stage is fed back as an input signal of an inverter of a first stage, wherein each of the inverters includes: a first input signal control unit configured to delay an input signal of each of the inverters by a first delay time or a second delay time and output a first delay input signal; a second input signal control unit configured to delay the input signal by a third delay time or a fourth delay time and output a second delay input signal; and a signal output unit configured to an output signal in response to the first delay input signal and the second delay input signal.

18 Claims, 5 Drawing Sheets

OSCILLATOR AND MEMORY SYSTEM INCLUDING THE SAME

CROSS-REFERENCE TO RELATED APPLICATION

The present application claims priority under 35 U.S.C. § 119(a) to Korean patent application number 10-2018-0028760, filed on Mar. 12, 2018, which is incorporated herein by reference in its entirety.

BACKGROUND

1. Field of Invention

The present disclosure generally relates to an electronic device, and more particularly, to an oscillator and a memory system including the same.

2. Description of Related Art

As mobile information devices using memory systems as storage media, particularly, smartphones, tablet PCs, and the like are increasingly used, interest in and the importance of memory devices have been further increased.

As various applications appear in addition to parallelization using high-speed processors or multicores, demand levels for semiconductor memory systems have been continuously increased in terms of not only performance but also reliability.

A memory system is a storage device implemented using a semiconductor such as silicon (Si), germanium (Ge), gallium arsenide (GaAs), or indium phosphide (InP). The memory system may be generally classified into a volatile memory device and a nonvolatile memory device. The volatile memory device is a memory device in which stored data disappears when the supply of power is interrupted. Examples of the volatile memory device include a static random access memory (SRAM), a dynamic RAM (DRAM), a synchronous DRAM (SDRAM), and the like. The nonvolatile memory device is a memory device in which stored data is retained even when the supply of power is interrupted. Examples of the nonvolatile memory device include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like. The flash memory is generally classified into a NOR type flash memory and a NAND type flash memory.

In a memory device and a memory controller, which are included in the memory system, a periodic signal is used to operate an internal circuit. A device for generating such a periodic signal is an oscillator. When a periodic signal is generated, it is of outmost importance to ensure that the periodic signal has an accurate period according to the design. Also, oscillators consume power and, hence, reducing their power consumption would be highly desirable.

SUMMARY

Embodiments of the present invention provide an accurate oscillator that is capable of reducing current consumption and a memory system including the same.

In accordance with an aspect of the present disclosure, there is provided an oscillator including an odd number of inverters sequentially coupled, in which an output signal of an inverter of a last stage is fed back as an input signal of an inverter of a first stage, wherein each of the inverters includes: a first input signal control unit configured to delay an input signal of each of the inverters by a first delay time or a second delay time and output a first delay input signal; a second input signal control unit configured to delay the input signal by a third delay time or a fourth delay time and output a second delay input signal; and a signal output unit configured to an output signal in response to the first delay input signal and the second delay input signal.

In accordance with another aspect of the present disclosure, there is provided an oscillator including: an oscillating unit including an odd number of inverters sequentially coupled, in which an output signal of an inverter of a last stage among the inverters is fed back as an input signal of an inverter of a first stage among the inverters; a power voltage supply unit configured to control a current corresponding to a power supply voltage supplied to the inverters in response to a drive signal; a bias unit configured to generate and output a bias voltage in response to the drive signal; and a ground voltage supply unit configured to control a current corresponding to a ground voltage supplied to the inverters in response to the bias voltage, wherein each of the inverters includes: a first input signal control unit configured to delay an input signal by a first delay time or a second delay time and output a first delay input signal; a second input signal control unit configured to delay the input signal by a third delay time or a fourth delay time and output a second delay input signal; and a signal output unit configured to generate an output signal in response to the first delay input signal and the second delay input signal.

In accordance with still another aspect of the present disclosure, there is provided a memory system including: a memory controller configured to generate and output a command in response to a request from a host; an oscillator including sequentially coupled an odd number of inverters, in which an output signal of an inverter of a last stage among the inverters is outputted as a clock signal, and the clock signal is fed back as an input signal of an inverter of a first stage among the inverters; and a memory device configured to perform an internal operation in response to the clock signal and the command, wherein each of the inverters includes: a first input signal control unit configured to delay an input signal of each of the inverters by a first delay time or a second delay time and output a first delay input signal; a second input signal control unit configured to delay the input signal by a third delay time or a fourth delay time and output a second delay input signal; and a signal output unit configured to an output signal in response to the first delay input signal and the second delay input signal.

BRIEF DESCRIPTION OF THE DRAWINGS

Example embodiments of the present invention will now be described more fully hereinafter with reference to the accompanying drawings; however, we note that the present invention may be embodied in different other forms and should not be construed as limited to the embodiments set forth herein. Rather, these embodiments are provided so that the disclosure of the present invention will be thorough and complete, and will fully convey the scope of the present invention to those skilled in the art to which the present invention pertains.

In the drawing figures, dimensions may be exaggerated for clarity of illustration. It will be understood that when an element is referred to as being "between" two elements, it

DETAILED DESCRIPTION

Figure 1:
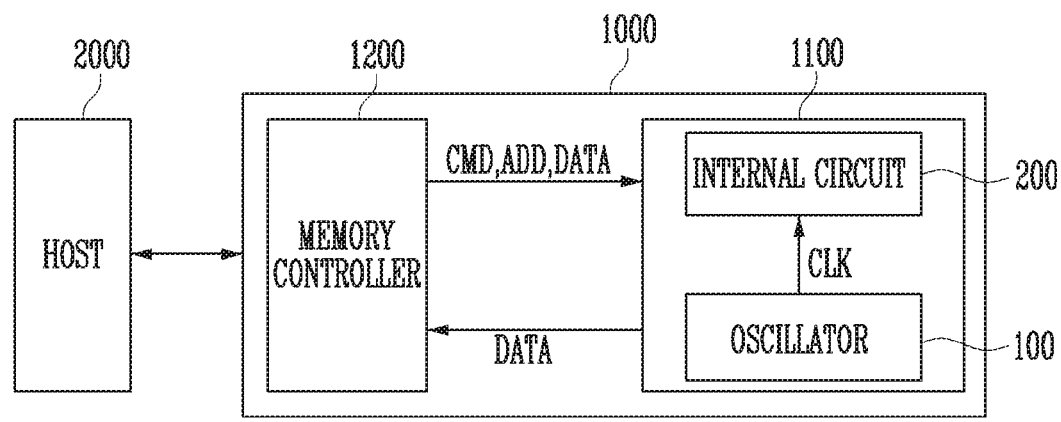
FIG. 1 is a diagram illustrating a memory system in accordance with an embodiment of the present disclosure.

The specific structural or functional description disclosed herein is merely illustrative for the purpose of describing embodiments in accordance with the concept of the present disclosure. The embodiments in accordance with the concept of the present disclosure can be implemented in various forms, and cannot be construed as limited to the embodiments set forth herein.

The embodiments in accordance with the concept of the present disclosure can be variously modified and have various shapes. Thus, the embodiments are illustrated in the drawings and are intended to be described herein in detail. However, the embodiments in accordance with the concept of the present disclosure are not construed as limited to specified disclosures, and include all changes, equivalents, or substitutes that do not depart from the spirit and technical scope of the present disclosure.

While terms such as "first" and "second" may be used to describe various components, such components must not be understood as being limited to the above terms. The above terms are used only to distinguish one component from another. For example, a first component may be referred to as a second component without departing from the scope of rights of the present disclosure, and likewise a second component may be referred to as a first component.

It will be understood that when an element is referred to as being "connected" or "coupled" to another element, it can be directly connected or coupled to the other element or intervening elements may also be present. In contrast, when an element is referred to as being "directly connected" or "directly coupled" to another element, no intervening elements are present. Meanwhile, other expressions describing relationships between components such as "between," "immediately between" or "adjacent to" and "directly adjacent to" may be construed similarly.

The terms used in the present application are merely used to describe particular embodiments, and are not intended to limit the present disclosure. Singular forms in the present disclosure are intended to include the plural forms as well, unless the context clearly indicates otherwise. It will be further understood that terms such as "including" or "having," etc., are intended to indicate the existence of the features, numbers, operations, actions, components, parts, or combinations thereof disclosed in the specification, and are not intended to preclude the possibility that one or more other features, numbers, operations, actions, components, parts, or combinations thereof may exist or may be added.

So far as not being differently defined, all terms used herein including technical or scientific terminologies have meanings that they are commonly understood by those skilled in the art to which the present disclosure pertains. The terms having the definitions as defined in the dictionary should be understood such that they have meanings consistent with the context of the related technique. So far as not being clearly defined in this application, terms should not be understood in an ideally or excessively formal way.

In describing those embodiments, description will be omitted for techniques that are well known to the art to which the present disclosure pertains, and are not directly related to the present disclosure. This intends to disclose the gist of the present disclosure more clearly by omitting unnecessary description.

Hereinafter, exemplary embodiments of the present disclosure will be described in detail with reference to the accompanying drawings in order for those skilled in the art to be able to readily implement the technical spirit of the present disclosure.

FIG. 1 is a diagram illustrating a memory system 1000 in accordance with an embodiment of the present disclosure.

Referring to FIG. 1, the memory system 1000 may include a memory device 1100 for storing data and a memory controller 1200 for controlling the memory device 1100. The memory controller 1200 may operate under the control of a host 2000.

The host 2000 may communicate with the memory system 1000 by using an interface protocol. Examples of suitable interface protocols may include a Peripheral Component Interconnect-Express (PCI-e or PCIe), Advanced Technology Attachment (ATA), a Serial ATA (SATA), a Parallel ATA (DATA), or a Serial Attached SCSI (SAS). Interface protocols between the host 2000 and the memory system 1000 are not limited to the above-described examples. For example, other interface protocols may include a Universal Serial Bus (USB), a Multi-Media Card (MMC), an Enhanced Small Disk Interface (ESDI), and Integrated Drive Electronics (IDE) and the like.

The memory device 1100 may operate under the control of the memory controller 1200. The memory device 1100 may include a memory cell array (not shown) having a plurality of memory cells organized in memory regions such as a plurality of memory blocks. Each memory block may include a plurality of pages. This organization of the memory cells is just an example of the various possibilities and the invention may not be limited in this way. In an embodiment, the memory device 1100 may be a flash memory device, however, the invention may not be limited in this way.

In operation, the memory device 1100 may receive a command CMD and an address ADD from the memory controller 1200 through at least one channel, and may access one or more areas of the memory cell array selected by the address ADD. That is, the memory device 1100 may perform an internal operation corresponding to the command CMD on one or more memory areas selected by the address ADD.

The memory device 1100 may include an oscillator 100 and an internal circuit 200. The oscillator 100 may generate and output a clock signal CLK having a certain period. The internal circuit 200 may perform an internal operation in response to the clock signal CLK received from the oscillator 100 and a command CMD, an address ADD, and data DATA, which are received from the memory controller 1200. The internal circuit 200 may include the memory cell array (not shown) and a peripheral circuit (not shown) for performing an operation such as a program operation, a read operation, and an erase operation on the memory cell array.

The memory controller 1200 may control the operations of the memory system 1000. The memory controller 1200 may control data exchange between the host 2000 and the memory device 1100. For example, the memory controller 1200 may control the memory device 1100 in response to a request received from the host 2000 to program data, read data, or erase programmed data. For example, the memory controller 1200 may output a command CMD, an address ADD, and data DATA, which correspond to an operation to be performed on the memory device 1100, in response to a request received from the host 2000. The memory controller 1200 may receive data DATA and output the received data DATA to the host 2000.

In the described embodiment of FIG. 1, an oscillator 100 is included in the memory device 1100. However, we note that this is just an exemplary configuration, and that, therefore, the present disclosure is not limited in this way. For example, in other embodiments, the oscillator 100 may be included in the memory controller 1200.

Figure 2:
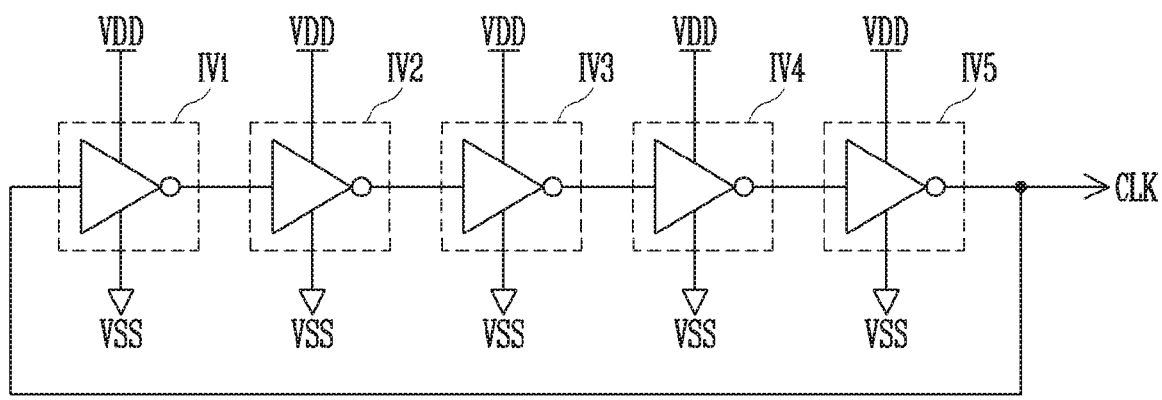
FIG. 2 is a circuit diagram illustrating an oscillator in accordance with an embodiment of the present disclosure.

FIG. 2 is a circuit diagram illustrating an oscillator in accordance with an embodiment of the present disclosure, for example, the oscillator 100 shown in FIG. 1.

Referring to FIG. 2, the oscillator 100 may include a plurality of inverters, e.g., inverters IV1 to IV5. In FIG. 2, a case where the oscillator 100 includes five inverters IV1 to IV5, i.e., an odd number of inverters. However, we note that this is illustrated as an example, and that the number of inverters is not limited to five or to an odd number only. The oscillator 100 may be a ring oscillator in which the inverters IV1 to IV5 are coupled in a chain structure. That is, the inverters IV1 to IV5 may be sequentially coupled, and an output signal of an inverter IV5 of the last stage may be directed as an input signal of first stage inverter IV1. The output signal of the inverter IV5 of the last stage (i.e. last stage inverter IV5) may be directed as a clock signal CLK. The output signal of the inverter IV5 of the last stage may be fed back as the input signal of the inverter IV1 of the first stage.

Each of the inverters IV1 to IV5 may be driven by receiving a power supply voltage VDD and a ground voltage VSS, which are applied thereto. Each of the inverters IV1 to IV5 may invert an input signal and output the inverted signal of the input signal. Through this procedure, the last stage inverter IV5 may generate and output a clock signal CLK having a certain period. The period of the clock signal CLK may be adjusted according to an RC delay value of each of the inverters IV1 to IV5.

Figure 3:
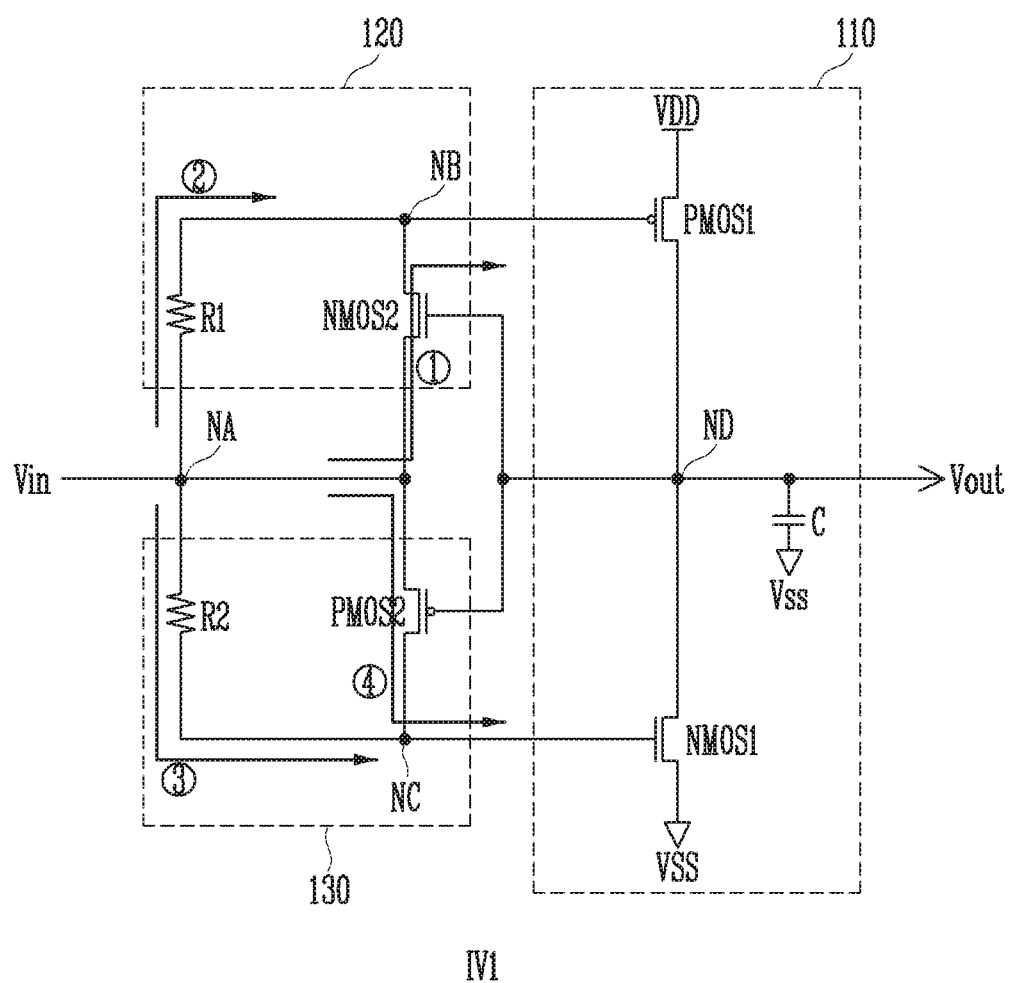
FIG. 3 is a circuit diagram illustrating an inverter in accordance with an embodiment of the present disclosure.

FIG. 3 is a circuit diagram illustrating an inverter in accordance with an embodiment of the present disclosure, for example, the inverter IV1 shown in FIG. 2.

The inverters IV1 to IV5 shown in FIG. 2 may have structures identical or similar to one another, and therefore, only the first inverter IV1 will be described in detail as an example.

Referring to FIG. 3, the first inverter IV1 may include a signal output unit 110, a first input signal control unit 120, and a second input signal control unit 130.

The signal output unit 110 generates and outputs an output signal Vout in response to an input signal Vin received through the first input signal control unit 120 and the second input signal control unit 130.

The signal output unit 110 includes a first PMOS transistor PMOS1 and a first NMOS transistor NMOS1 coupled in series between a terminal for the power supply voltage VDD and a terminal for the ground supply voltage VSS. The first PMOS transistor PMOS1 may apply the power supply voltage VDD to an output node ND or may interrupt the application of the power supply voltage VDD to the output node ND in response to the input signal Vin received through the first input signal control unit 120. The first NMOS transistor NMOS1 may apply the ground voltage VSS to the output node ND or may interrupt the application of the ground voltage VSS to the output node ND in response to the input signal Vin received through the second input signal control unit 130. The signal output unit 110 may further include a capacitor C coupled between the output node ND and a terminal for the ground voltage VSS.

The first input signal control unit 120 may receive the input signal Vin and transmit the input signal Vin to the signal output unit 110. The first input signal control unit 120 may adjust a delay time of the input signal Vin in response to a potential level of the output node ND and transmit the adjusted input signal Vin to the signal output unit 110.

The first input signal control unit 120 may include a resistor R1 and a second NMOS transistor NMOS2 coupled in parallel between a node NB coupled to a gate of the first PMOS transistor PMOS1 and a node NA to which the input signal Vin is received. A gate of the second NMOS transistor NMOS2 is coupled to the output node ND.

When the potential level of the output node ND has a first logic level (i.e., a level of the power supply voltage VDD), the first input signal control unit 120 may delay the input signal Vin by a first delay time through the second NMOS transistor NMOS2 and output the delayed input signal Vin to the signal output unit 110 (①). When the potential level of the output node ND has a second logic level (i.e., a level of the ground voltage VSS), the first input signal control unit 120 may delay the input signal Vin by a second delay time through the resistor R1 and transmit the delayed input signal Vin to the signal output unit 110 (②). The first delay time is preferably less than the second delay time.

The second input signal control unit 130 receives the input signal Vin and transmits the input signal Vin to the signal output unit 110. The second input signal control unit 130 may adjust the delay time of the input signal Vin in response to the potential level of the output node ND and transmit the adjusted input signal Vin to the signal output unit 110.

The second input signal control unit 130 may include a resistor R2 and a second PMOS transistor PMOS2 coupled in parallel between a node NC coupled to a gate of the first NMOS transistor NMOS1 and the node NA to which the input signal Vin is received. A gate of the second PMOS transistor PMOS2 may be coupled to the output node ND.

When the potential level of the output node ND has the first logic level (i.e., the level of the power supply voltage VDD), the second input signal control unit 130 may delay the input signal Vin by a third delay time through the resistor R2 and transmit the delayed input signal to the signal output unit 110 (③). When the potential level of the output node ND has the second logic level (i.e., the level of the ground voltage VSS), the second input signal control unit 130 may delay the input signal Vin by a fourth delay time through the second PMOS transistor PMOS2 and transmit the delayed input signal Vin to the signal output unit 110 (④). The third delay time is preferably greater than the first delay time and the fourth delay time. In addition, the fourth delay time is preferably less than the second delay time.

An operation of the above-described inverter IV1 will now be described as follows.

In the inverter IV1, a case where the input signal Vin has the second logic level (i.e., the level of the ground voltage VSS) in an initial setting is assumed and described.

Accordingly, in operation, the first input signal control unit 120 and the second input signal control unit 130 may receive the input signal Vin having the second logic level (i.e., the level of the ground voltage VSS), and may therefore output the input signal Vin to the signal output unit 110. The first PMOS transistor PMOS1 of the signal output unit 110 may be turned on in response to the input signal Vin having the second logic level (i.e., the level of the ground voltage VSS), and the first NMOS transistor NMOS 1 of the signal output unit 110 may be turned off in response to the input signal Vin having the second logic level (i.e., the level of the ground voltage VSS). Therefore, the potential level of the output node ND may be initially set to the first logic level (i.e., the level of the power supply voltage VDD).

The level of the input signal Vin may be shifted from the second logic level (i.e., the level of the ground voltage VSS) to the first logic level (i.e., the level of the power supply voltage VDD). The second NMOS transistor NMOS2 of the first input signal control unit 120 is turned on in response to the potential level of the output node ND having the first logic level (i.e., the level of the power supply voltage VDD). The first input signal control unit 120 delays the input signal Vin by the first delay time through the second NMOS transistor NMOS2 and outputs the delayed input signal Vin to the signal output unit 110. The first PMOS transistor PMOS1 of the signal output unit 110 is turned off in response to the input signal Vin received through the first input signal control unit 120. The second PMOS transistor PMOS2 of the second input signal control unit 130 is turned off in response to the potential level of the output node ND, which has the first logic level (i.e., the level of the power supply voltage VDD). The second input signal control unit 130 may delay the input signal Vin by the third delay time through the resistor R2 and transmit the delayed input signal Vin to the signal output unit 110. The first NMOS transistor NMOS1 of the signal output unit 110 is turned on in response to the input signal Vin received through the second input signal control unit 130. Therefore, the output node ND may output the output signal Vout having the second logic level (i.e., the level of the ground voltage VSS).

The first input signal control unit 120 may delay the input signal Vin by the first delay time and transmit the delayed input signal Vin to the signal output unit 110. The second input signal control unit 130 may delay the input signal Vin by the second delay time greater than the first delay time and transmit the delayed input signal Vin to the signal output unit 110. Therefore, after the first PMOS transistor PMOS1 of the signal output unit 110 is turned off in response to the input signal Vin received through the first input signal control unit 120, the first NMOS transistor NMOS1 of the signal output unit 110 is turned on in response to the input signal Vin received through the second input signal control unit 130. Accordingly, since a period in which the first PMOS transistor PMOS1 and the first NMOS transistor NMOS1 are turned on together is avoided, unnecessary current consumption may be prevented from occurring when the power supply voltage VDD which is supplied through the first PMOS transistor PMOS1 moves to the ground voltage VSS through the first NMOS transistor NMOS1.

The level of the input signal Vin may be shifted from the first logic level (i.e., the level of the power supply voltage VDD) to the second logic level (i.e., the level of the ground voltage VSS). The second NMOS transistor NMOS2 of the first input signal control unit 120 is turned off in response to the potential level of the output node ND having the second logic level (i.e., the level of the ground voltage VSS). The first input signal control unit 120 may delay the input signal Vin by the second delay time through the resistor R1 and transmit the delayed input signal Vin to the signal output unit 110. The first PMOS transistor PMOS1 of the signal output unit 110 is turned on in response to the input signal Vin received through the first input signal control unit 120. The second PMOS transistor PMOS2 of the second input signal control unit 130 is turned on in response to the potential level of the output node ND having the second logic level (i.e., the level of the ground voltage VSS). The second input signal control unit 130 may delay the input signal Vin by the fourth delay time through the second PMOS transistor PMOS2 and transmit the delayed input signal Vin to the signal output unit 110. The first NMOS transistor NMOS1 of the signal output unit 110 is turned off in response to the input signal Vin received through the second input signal control unit 130. Therefore, the output node ND may output the output signal Vout having the first logic level (i.e., the level of the power voltage VDD).

The first input signal control unit 120 may delay the input signal Vin by the second delay time and transmit the delayed input signal Vin to the signal output unit 110. The second input signal control unit 130 may delay the input signal Vin by the fourth delay time less than the first delay time and transmit the delayed input signal Vin to the signal output unit 110. Therefore, after the first NMOS transistor NMOS1 of the signal output unit 110 is turned off in response to the input signal Vin received through the second input signal control unit 130, the first PMOS transistor PMOS1 of the signal output unit 110 is turned on in response to the input signal Vin received through the first input signal control unit 120. Accordingly, since a period in which the first PMOS transistor PMOS1 and the first NMOS transistor NMOS1 are turned on together is avoided, unnecessary current consumption may be prevented from occurring when the power supply voltage VDD supplied through the first PMOS transistor PMOS1 moves to the ground voltage VSS through the first NMOS transistor NMOS1.

Figure 4:
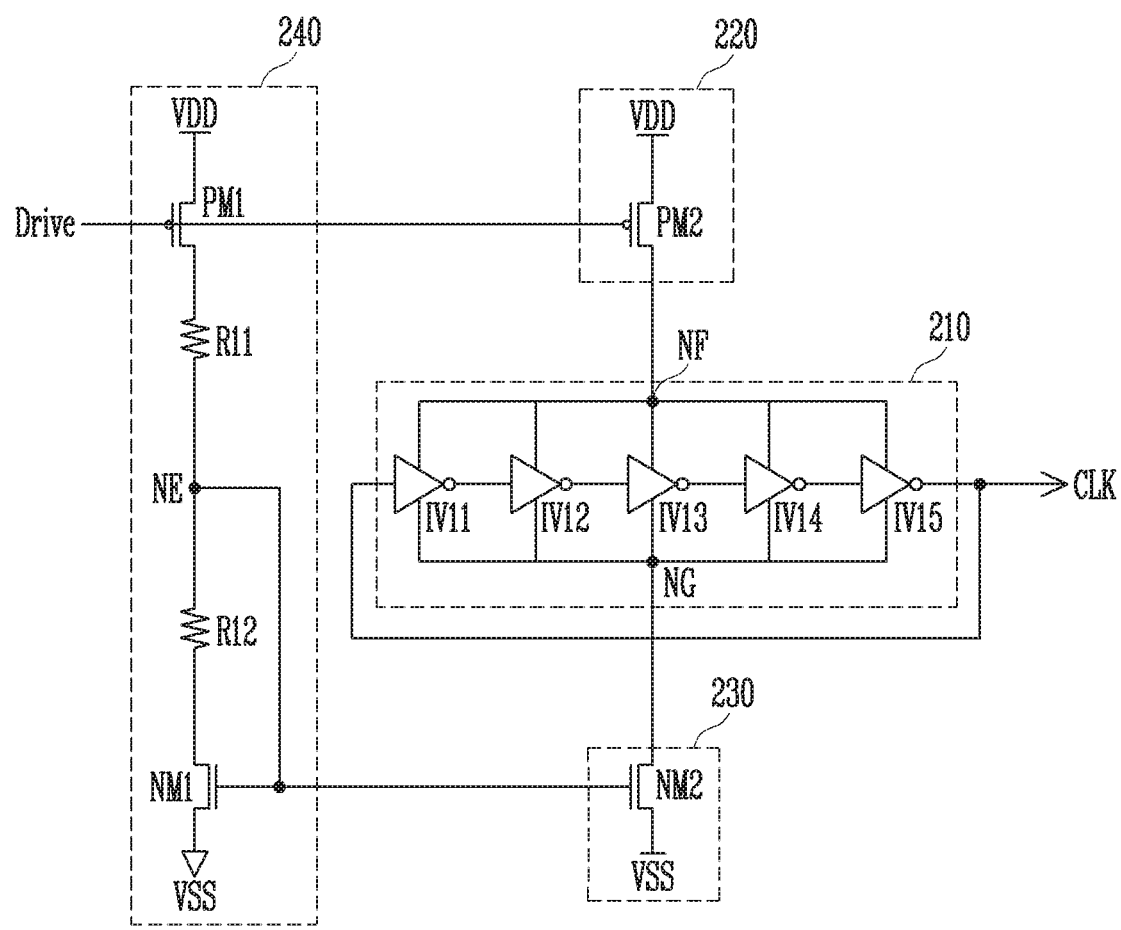
FIG. 4 is a circuit diagram illustrating an oscillator in accordance with another embodiment of the present disclosure.

FIG. 4 is a circuit diagram illustrating an oscillator 100 in accordance with another embodiment of the present disclosure.

Referring to FIG. 4, the oscillator 100 may include an oscillating unit 210, a power voltage supply unit 220, a ground voltage supply unit 230, and a bias unit 240.

The oscillating unit 210 may be designed to have the same structure as the oscillator shown in FIG. 2. The oscillating unit 210 may include a plurality of inverters, for example, inverters IV11 to IV15. A case where the oscillating unit 210 includes five inverters IV11 to IV15 as an odd number of inverters is illustrated in FIG. 4. In the oscillating unit 210, the inverters IV11 to IV15 are coupled in a chain structure. That is, the inverters IV11 to IV15 may be sequentially coupled, and an output signal of the inverter IV15 of the last stage may be directed as an input signal of the inverter IV11 of a first stage. The output signal of the inverter IV15 of the last stage may be directed as an outputted as a clock signal CLK.

Each of the inverters IV11 to IV15 may be supplied with a power supply voltage VDD through a node NF, and may be supplied with a ground voltage VSS through a node NG.

The power voltage supply unit 220 may be coupled between a terminal for the power supply voltage VDD and the node NF of the oscillating unit 210. The power voltage supply unit 220 may supply the power supply voltage VDD to the oscillating unit 210 in response to a drive signal Drive. The power voltage unit 220 may be implemented with a PMOS transistor PM2.

The ground voltage supply unit 230 may be coupled between the node NG and a terminal for the ground supply voltage VSS. The ground voltage supply unit 230 may supply the ground voltage VSS to the oscillating unit 210 in response to a bias voltage provided from the bias unit 240. The ground voltage supply unit 230 may be implemented with an NMOS transistor NM2.

The bias unit 240 may apply a bias voltage to the ground voltage supply unit 230 in response to the drive signal Drive. The bias unit 240 may adjust the potential level of the bias voltage according to the potential level of the drive signal Drive and provide the ground voltage supply unit 230 with the adjusted bias voltage.

The bias unit 240 may include a PMOS transistor PM1, first and second resistors R11 and R12, and an NMOS transistor NM1, which are coupled in series between a terminal for the power supply voltage VDD and a terminal for the ground voltage VSS. The gate of the NMOS transistor NM1 may be coupled to a node NE between the first resistor R11 and the second resistor R12. That is, the NMOS transistor NM1 may have a diode coupling structure. The bias unit 240 may output the bias voltage at the node NE in response to the drive signal Drive. The bias voltage may be determined by dividing the power supply voltage VDD according to the ratio of a total resistance value of the PMOS transistor PM1 and the resistor R11 and a total resistance value of the resistor R12 and the NMOS transistor NM1.

In the oscillator 100, the potential level of the bias voltage applied to the ground voltage supply unit 230 may be adjusted according to the potential level of the drive signal Drive which is applied to the bias unit 240. Therefore, the current flowing from the oscillating unit 210 to the terminal for the ground voltage VSS may be adjusted according to the potential level of the drive signal Drive. In addition, the power voltage supply unit 220 may adjust the current corresponding to the power voltage VDD applied to the oscillating unit 210. Thus, the current corresponding to the power supply voltage VDD applied to the oscillating unit 210 and the current flowing from the oscillating unit 210 to the ground voltage VSS may be adjusted by adjusting the potential level of the drive signal Drive, so that the RC delay values of the inverters IV11 to IV15 which are included in the oscillating unit 210 may be adjusted. Accordingly, the oscillator 100 may adjust the period of the clock signal CLK by adjusting the potential level of the drive signal Drive.

Further, the inverters IV11 to IV15 included in the oscillating unit 210 may be designed as shown in FIG. 3, so that the occurrence of unnecessary current consumption may be prevented.

Figure 5:
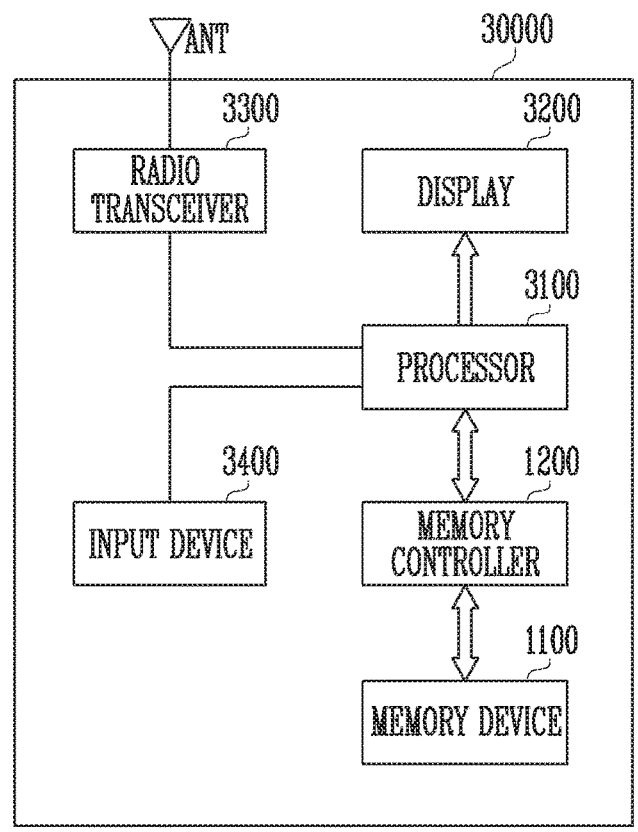
FIG. 5 is a diagram illustrating a memory system in accordance with an embodiment of the present disclosure.

FIG. 5 is a diagram illustrating a memory system 30000 in accordance with an embodiment of the present disclosure.

Referring to FIG. 5, the memory system 30000 may be implemented as a cellular phone, a smart phone, a tablet PC, a personal digital assistant (PDA), or a wireless communication device. The memory system 30000 may include a memory device 1100 and a memory controller 1200 for controlling an operation of the memory device 1100. The memory controller 1200 may control a data access operation of the memory device 1100, e.g., a program operation, an erase operation, a read operation, or the like under the control of a processor 3100.

Data programmed in the memory device 1100 may be directed as an output through a display 3200 under the control of the memory controller 1200.

A radio transceiver 3300 may transmit and/or receive radio signals through an antenna ANT. For example, the radio transceiver 3300 may convert a radio signal received through the antenna ANT into a signal that can be processed by the processor 3100. Therefore, the processor 3100 may process a signal output received from the radio transceiver 3300 and transmit the processed signal to the memory controller 1200 or to the display 3200. The memory controller 1200 may transmit the signal processed by the processor 3100 to the memory device 1100. Also, the radio transceiver 3300 may convert a signal output received from the processor 3100 into a radio signal, and output the converted radio signal to an external device (not shown) through the antenna ANT. An input device 3400 may input a control signal for controlling an operation of the processor 3100 or data to be processed by the processor 3100. The input device 3400 may be implemented as a pointing device such as a touch pad, a computer mouse, a keypad, a keyboard and the like. The processor 3100 may control an operation of the display 3200 such that a data output from the memory controller 1200, a data output from the radio transceiver 3300, or a data output from the input device 3400 can be directed to the display 3200.

In some embodiments, the memory controller 1200 capable of controlling an operation of the memory device 1100 may be implemented as a part of the processor 3100. In other embodiments, the memory controller 1200 capable of controlling an operation of the memory device 1100 may be implemented as a chip separate from the processor 3100. Also, the memory controller 1200 may be implemented with the memory controller shown in FIG. 1, and the memory device 1100 may be implemented with the memory device shown in FIG. 1.

Figure 6:
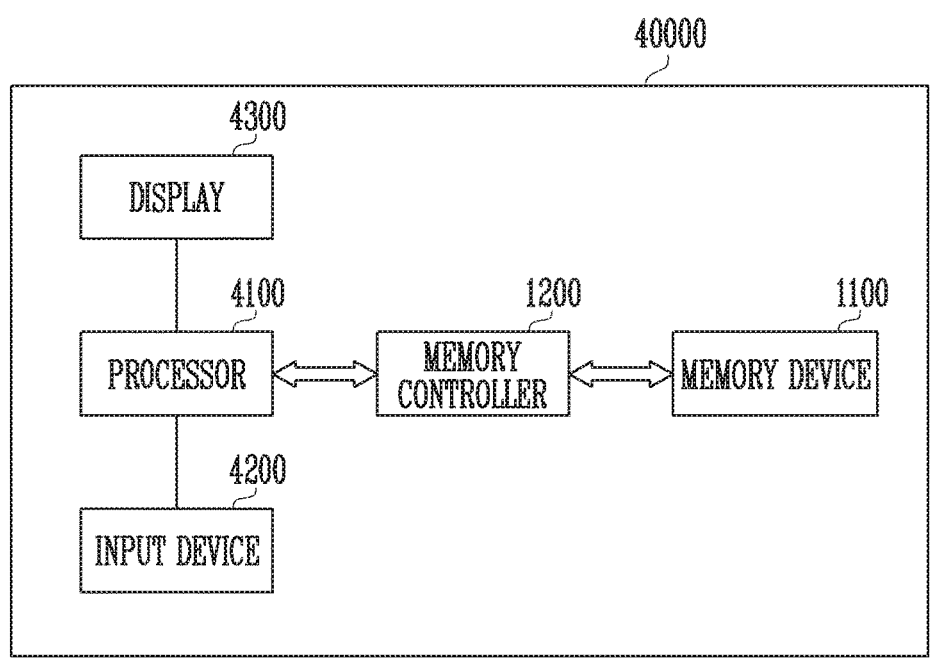
FIG. 6 is a diagram illustrating a memory system in accordance with an embodiment of the present disclosure.

FIG. 6 is a diagram illustrating a memory system 40000 in accordance with an embodiment of the present disclosure.

Referring to FIG. 6, the memory system 40000 may be implemented as a personal computer (PC), a tablet PC, a net-book, an e-reader, a personal digital assistant (PDA), a portable multi-media player (PMP), an MP3 player, or an MP4 player.

The memory system 40000 may include a memory device 1100 and a memory controller 1200 capable of controlling a data processing operation of the memory device 1100.

A processor 4100 may output data stored in the memory device 1100 to a display 4300 according to a data input received through an input device 4200. For example, the input device 4200 may be implemented as a pointing device such as a touch pad, a computer mouse, a keypad, a keyboard and the like.

The processor 4100 may control the operations of the memory system 40000. The processor 4100 may control an operation of the memory controller 1200. In some embodiments, the memory controller 1200 capable of controlling an operation of the memory device 1100 may be implemented as a part of the processor 4100. In other embodiments, the memory controller 1200 may be implemented as a chip separate from the processor 4100. Also, the memory controller 1200 may be implemented with the memory controller shown in FIG. 1, and the memory device 1100 may be implemented with the memory device shown in FIG. 1.

Figure 7:
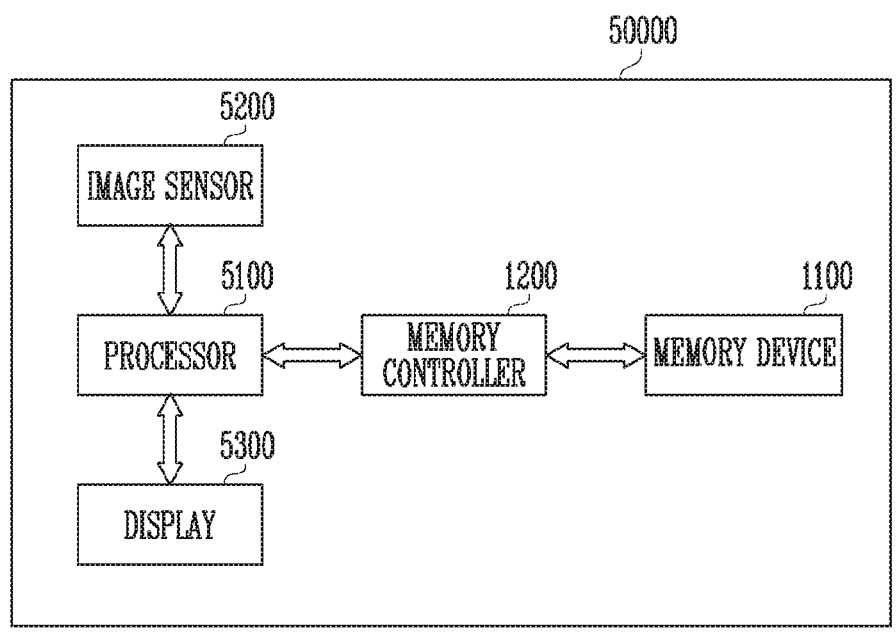
FIG. 7 is a diagram illustrating a memory system in accordance with an embodiment of the present disclosure.

FIG. 7 is a diagram illustrating a memory system 50000 in accordance with an embodiment of the present disclosure.

Referring to FIG. 7, the memory system 50000 may be implemented as an image processing device, e.g., a digital camera, a mobile terminal having a digital camera attached thereto, a smart phone having a digital camera attached thereto, or a tablet personal computer (PC) having a digital camera attached thereto.

The memory system 50000 may include a memory device 1100 and a memory controller 1200 capable of controlling a data processing operation of the memory device 1100, e.g., a program operation, an erase operation, or a read operation. Further, the memory system 50000 may include a processor 5100, an image sensor 5200 and a display 5300.

The image sensor 5200 may convert an optical image into digital signals, and the converted digital signals may be transmitted to a processor 5100 or the memory controller 1200. Under the control of the processor 5100, the converted digital signals may be directed as an output to the display 5300, or be stored in the memory device 1100 through the memory controller 1200. In addition, data stored in the memory device 1100 may be directed as an output to the display 5300 under the control of the processor 5100 or the memory controller 1200.

In some embodiments, the memory controller 1200 capable of controlling an operation of the memory device 1100 may be implemented as a part of the processor 5100. In other embodiments, the memory controller 1200 may be implemented as a chip separate from the processor 5100. Also, the memory controller 1200 may be implemented with the memory controller shown in FIG. 1, and the memory device 1100 may be implemented with the memory device shown in FIG. 1.

Figure 8:
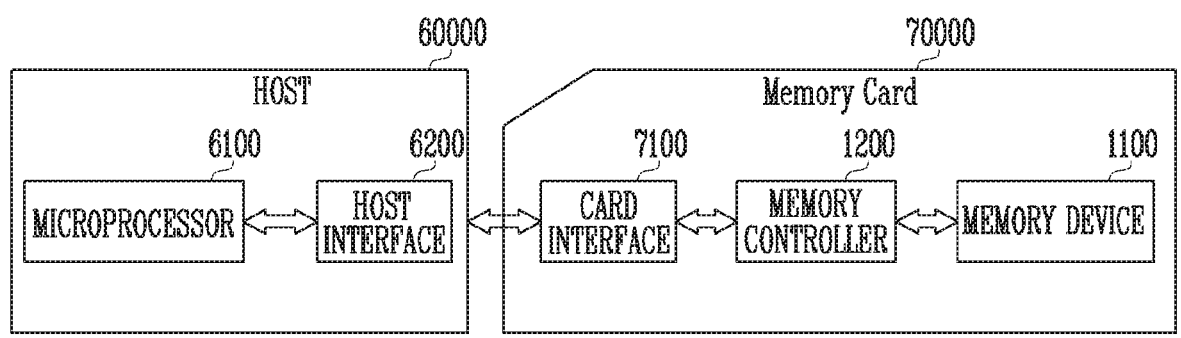
FIG. 8 is a diagram illustrating a memory system in accordance with an embodiment of the present disclosure.

FIG. 8 is a diagram illustrating a memory system 70000 in accordance with an embodiment of the present disclosure.

Referring to FIG. 8, the memory system 70000 may be implemented as a memory card or a smart card. The memory system 70000 may include a memory device 1100, a memory controller 1200, and a card interface 7100.

The memory controller 1200 may control data exchange between the memory device 1100 and the card interface 7100. In some embodiments, the card interface 7100 may be a secure digital (SD) card interface or a multi-media card (MMC) interface, but the present disclosure is not limited thereto.

The card interface 7100 may interface data exchange between a host 60000 and the memory controller 1200 according to a protocol of the host 60000. In some embodiments, the card interface 7100 may support a universal serial bus (USB) protocol and an inter-chip (IC)-USB protocol. The card interface 7100 may include hardware capable of supporting a protocol used by the host 60000, software embedded in the hardware, or a signal transmission scheme.

When the memory system 70000 is coupled to a host interface 6200 of the host 60000 such as a personal computer (PC), a tablet PC, a digital camera, a digital audio player, a cellular phone, console video game hardware, or a digital set-top box, the host interface 6200 may perform data communication with the memory device 1100 through the card interface 7100 and the memory controller 1200 under the control of a microprocessor 6100. In addition, the memory controller 1200 may be implemented with the memory controller shown in FIG. 1, and the memory device 1100 may be implemented with the memory device shown in FIG. 1.

in accordance with the present disclosure, the current consumption of a plurality of inverters included in the oscillator may be reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. An oscillator comprising an odd number of inverters sequentially coupled, in which an output signal of an inverter of a last stage is fed back as an input signal of an inverter of a first stage, wherein each of the inverters includes:
   a first input signal control unit configured to delay an input signal of each of the inverters by a first delay time or a second delay time and output a first delay input signal in response to a corresponding output signal;
   a second input signal control unit configured to delay the input signal by a third delay time or a fourth delay time and output a second delay input signal in response to the corresponding output signal; and
   a signal output unit configured to the corresponding output signal in response to the first delay input signal and the second delay input signal.

2. The oscillator of claim 1, wherein the second delay time is greater than the first delay time, and the third delay time is greater than the fourth delay time.

3. The oscillator of claim 2, wherein the third delay time is greater than the first delay time, and the second delay time is greater than the fourth delay time.

4. The oscillator of claim 3, wherein the signal output unit includes a first PMOS transistor coupled between a terminal for a power supply voltage and an output node to which the corresponding output signal is outputted, and a first NMOS transistor coupled between the output node and a terminal for a ground voltage,
   wherein the first PMOS transistor is turned on or turned off in response to the first delay input signal, and the first NMOS transistor is turned on or turned off in response to the second delay input signal.

5. The oscillator of claim 4, wherein, after the first PMOS transistor is turned off in response to the first delay input signal having the first delay time, the first NMOS transistor is turned on in response to the second delay input signal having the third delay time.

6. The oscillator of claim 4, wherein, after the first NMOS transistor is turned off in response to the second delay input signal having the fourth delay time, the first PMOS transistor is turned on in response to the first delay input signal having the second delay time.

7. The oscillator of claim 4, wherein the first input signal control unit includes a resistor and a second NMOS transistor coupled in parallel between a gate of the first PMOS transistor and a node to which the input signal is inputted.

8. The oscillator of claim 7, wherein the resistor delays the input signal by the second delay time, and the second NMOS transistor delays the input signal by the first delay time in response to the corresponding output signal.

9. The oscillator of claim 4, wherein the second input signal control unit includes a resistor and a second PMOS transistor, which are coupled in parallel between the node to which the input signal is inputted and a gate of the first NMOS transistor.

10. The oscillator of claim 9, wherein the resistor delays the input signal by the third delay time, and the second PMOS transistor delays the input signal by the fourth delay time in response to the corresponding output signal.

11. An oscillator comprising:
an oscillating unit including an odd number of inverters sequentially coupled, in which an output signal of an inverter of a last stage among the inverters is fed back as an input signal of an inverter of a first stage among the inverters;
a power voltage supply unit configured to control a current corresponding to a power supply voltage supplied to the inverters in response to a drive signal;
a bias unit configured to generate and output a bias voltage in response to the drive signal; and
a ground voltage supply unit configured to control a current corresponding to a ground voltage supplied to the inverters in response to the bias voltage,
wherein each of the inverters includes:
a first input signal control unit configured to delay an input signal by a first delay time or a second delay time and output a first delay input signal in response to a corresponding output signal;
a second input signal control unit configured to delay the input signal by a third delay time or a fourth delay time and output a second delay input signal in response to the corresponding output signal; and
a signal output unit configured to generate the corresponding output signal in response to the first delay input signal and the second delay input signal.

12. The oscillator of claim 11, wherein the second delay time is greater than the first delay time, the third delay time is greater than the fourth delay time, the third delay time is greater than the first delay time, and the second delay time is greater than the fourth delay time.

13. The oscillator of claim 12, wherein the signal output unit includes a PMOS transistor coupled between a terminal for a power supply voltage and an output node to which the corresponding output signal is outputted, and an NMOS transistor coupled between the output node and a terminal for a ground voltage,
wherein the PMOS transistor is turned on or turned off in response to the first delay input signal, and the NMOS transistor is turned on or turned off in response to the second delay input signal.

14. The oscillator of claim 13, wherein, after the PMOS transistor is turned off in response to the first delay input signal having the first delay time, the NMOS transistor is turned on in response to the second delay input signal having the third delay time, and
wherein, after the NMOS transistor is turned off in response to the second delay input signal having the fourth delay time, the PMOS transistor is turned on in response to the first delay input signal having the second delay time.

15. A memory system comprising:
a memory controller configured to generate and output a command in response to a request from a host;
an oscillator including sequentially coupled an odd number of inverters, in which an output signal of an inverter of a last stage among the inverters is outputted as a clock signal, and the clock signal is fed back as an input signal of an inverter of a first stage among the inverters; and
a memory device configured to perform an internal operation in response to the clock signal and the command,
wherein each of the inverters includes:
a first input signal control unit configured to delay an input signal of each of the inverters by a first delay time or a second delay time and output a first delay input signal in response to a corresponding output signal;
a second input signal control unit configured to delay the input signal by a third delay time or a fourth delay time and output a second delay input signal in response to the corresponding output signal; and
a signal output unit configured to the corresponding output signal in response to the first delay input signal and the second delay input signal.

16. The memory system of claim 15, wherein the second delay time is greater than the first delay time, the third delay time is greater than the fourth delay time, the third delay time is greater than the first delay time, and the second delay time is greater than the fourth delay time.

17. The memory system of claim 16, wherein the signal output unit includes a PMOS transistor coupled between a terminal to which a power supply voltage is applied and an output node to which the corresponding output signal is output, and an NMOS transistor coupled between the output node and a terminal for a ground voltage,
wherein the PMOS transistor is turned on or turned off in response to the first delay input signal, and the NMOS transistor is turned on or turned off in response to the second delay input signal.

18. The memory system of claim 17, wherein, after the PMOS transistor is turned off in response to the first delay input signal having the first delay time, the NMOS transistor is turned on in response to the second delay input signal having the third delay time, and
wherein, after the NMOS transistor is turned off in response to the second delay input signal having the fourth delay time, the PMOS transistor is turned on in response to the first delay input signal having the second delay time.

* * * * *